United States Patent
Little

(10) Patent No.: US 7,233,833 B2
(45) Date of Patent: Jun. 19, 2007

(54) METHOD OF MODIFYING LOW FREQUENCY COMPONENTS OF A DIGITAL AUDIO SIGNAL

(75) Inventor: Max Andrew Little, Reading (GB)

(73) Assignee: Creative Technology Ltd, Singapore (SG)

(*) Notice: Subject to any disclaimer, the term of this patent is extended or adjusted under 35 U.S.C. 154(b) by 260 days.

(21) Appl. No.: 10/659,049

(22) Filed: Sep. 10, 2003

(65) Prior Publication Data

US 2004/0114769 A1 Jun. 17, 2004

Related U.S. Application Data

(63) Continuation of application No. PCT/GB02/00987, filed on Mar. 6, 2002.

(30) Foreign Application Priority Data

Mar. 10, 2001 (GB) ................................ 0105975.7

(51) Int. Cl.
*G06F 17/00* (2006.01)
*H03G 7/00* (2006.01)
*H03G 3/20* (2006.01)

(52) U.S. Cl. ........................ 700/94; 381/106; 381/107

(58) Field of Classification Search ................ 381/106, 381/98, 107, 1, 17, 61; 700/94
See application file for complete search history.

(56) References Cited

U.S. PATENT DOCUMENTS 4,602,381 A * 7/1986 Cugnini et al. ................ 381/13
5,359,665 A * 10/1994 Werrbach ..................... 381/102
5,524,060 A * 6/1996 Silfvast et al. ............... 381/104
6,606,388 B1 * 8/2003 Townsend et al. ............. 381/17

OTHER PUBLICATIONS

Syntrillium Software Corp., Cool Edit User's Manual, copyright 1992-1996, version 1.53 and 95.*
Syntrillium Software Corp., Cool Edit 2000 main webpage [http://web.archive.org/web/20000229111435/63.90.82.57/cooledit/main.html], Feb. 29, 2000.*

* cited by examiner

*Primary Examiner*—Sinh Tran
*Assistant Examiner*—Daniel R. Sellers
(74) *Attorney, Agent, or Firm*—Russell N. Swerdon

(57) ABSTRACT

A method of modifying low frequency components of a digital audio signal having left and right channel signals, including the steps of: a) filtering the left and right channels signals using respective left and right high-pass filters to form left and right high-pass filtered signals; b) filtering the left and right channel signals using respective left and right band-pass filters to form left and right low frequency signals; c) modifying the amplitude of the left and right low frequency signals to give modified left and right low frequency signals whereby signals with amplitude a where $0<a<a1$ are amplified by a first constant value C1, signals with amplitude $a1 \leq a<a2$ are amplified proportional to $1/a$, signals with amplitude $a=2a$ are unchanged, signals with amplitude $a2<a<a3$ are attenuated proportional to $1/a$, and signals with amplitude $a=a3$ are attenuated by a second constant value C2; and d) combining the modified band-pass filtered left and right signals with the respective left and right high-pass filtered signals to form respective modified left and right channel audio signals.

17 Claims, 4 Drawing Sheets

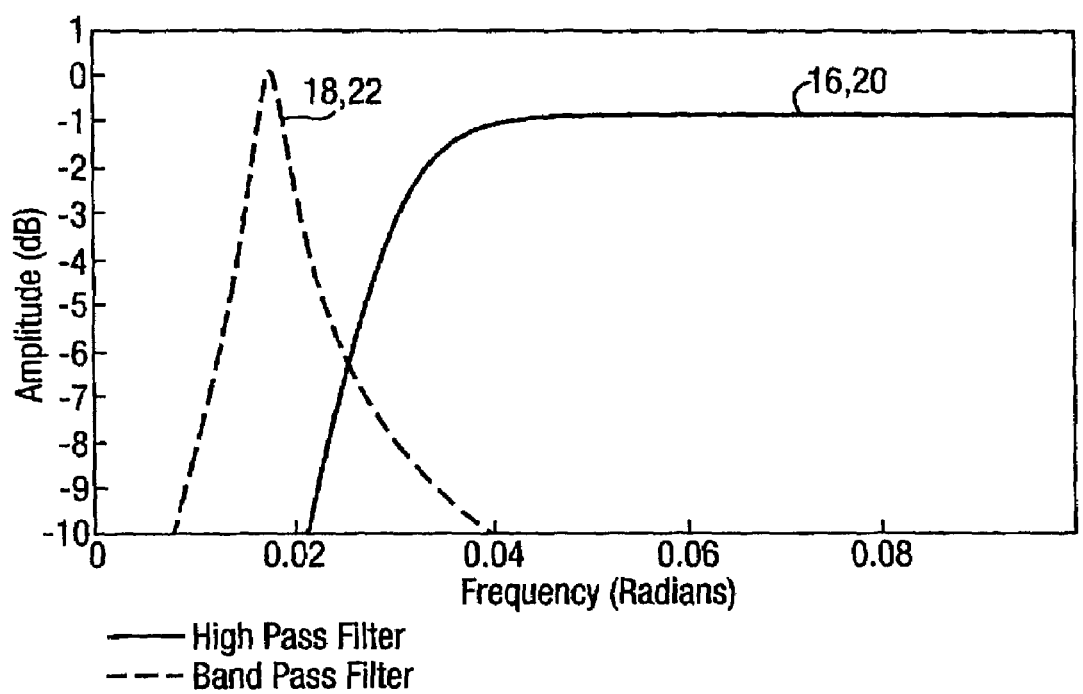

METHOD OF MODIFYING LOW FREQUENCY COMPONENTS OF A DIGITAL AUDIO SIGNAL

RELATED APPLICATION

This application is a continuation of International Patent Application No. PCT/GB02/00987 filed Mar. 6, 2002, which is here incorporated by reference in its entirety.

BACKGROUND OF THE INVENTION

1. Field of the Invention

The present invention relates to a method of modifying low frequency components of a digital audio signal.

2. Prior Art

When music is performed live using large public address loudspeakers, low-frequency vibrations (below approximately 50 Hz) are generated. These low frequency vibrations travel through the floor and are mechanically coupled to listeners in the audience, causing them to sense the vibrations through their feet and also within the chest cavity. Engineers in recording studios, when mixing music must create a musical balance such that all frequency ranges (low, mid and high) can be reproduced on a wide range of loudspeakers. When this mixed music is listened to at home, or in another setting. it is likely to be using much smaller loudspeakers than those used for live performances. These smaller loudspeakers are often inadequate at reproducing low (i.e., bass) frequencies, and this sometimes leads to a degradation in the quality of the listening experience. This problem has been addressed by using methods of enhancing the low frequency parts of an audio signal so that the quality of the music when played over small loudspeakers is improved.

A method for digitally modifying low frequency components of audio signals should satisfy the following design constraints;

a) music processed using the method should not sound unpleasant (constraint c1);
b) the method should not noticeably alter the tonal character of musical instruments (constraint c2);
c) the method should also not noticeably affect high frequency signals (constraint c3);
d) the method should not alter the balance of left and right channels of the stereo signal (constraint c4);
e) the method should not be prohibitively complex (constraint c5);
f) the method must not cause the maximum signal level of the digital system to be exceeded (constraint c6); and
g) the method must not amplify or introduce very low frequency signals that cannot be reproduced by small loudspeakers (constraint c7).

In digital signal processing, it is essential that the maximum signal level (i.e., unity) of the audio signal is never exceeded, otherwise extreme audible artifacts can result. For example, considering a 16-bit audio signal, the range of signal values is −32,768 to +32,767 (i.e., $2^{16}$ different values). If the signal value exceeds +32,767 then the signal value overflows to −32,768 rather than to its next highest value of +32,768. This creates extreme artifacts in the audio signal, and it is therefore vital to insure that the maximum signal limits are never exceeded. In analogue systems this type of signal overflow does not occur on account of the operating tolerances of devices such as valves, diodes, capacitors, transistors and resisters.

Low frequency audio signals may be enhanced using a number of techniques, some of which will now be discussed. One method of enhancing such signals is by the use of equalization wherein either one or many filters with different gain values process the signal, and lower frequency signals are given higher gain values. Thus low frequencies (and hence bass instruments) are emphasized by virtue of the fact that lower frequency energy is amplified. However, since most of the signal energy in a musical audio signal is concentrated into the lower frequencies this technique cannot amplify the low frequency signals very much before the maximum signal level in the system is exceeded, or the music sounds distorted. This method therefore breaks constraints c6 and c7.

Multi-band compression is another technique that may he used to enhance bass frequencies. In this technique one or many filters are arranged in parallel, as in equalization. The output of each filter is processed by a dynamic compressor that measures the current signal level in that frequency hand and applies a gain whose amount is related to that measurement. The signal energy in each frequency band is averaged over time and the compressors are arranged to operate such that the bass frequency bands are kept at a higher average energy than the higher frequency bands. Bass instruments (such as bass drums, guitars etc) are therefore emphasized because the signal energy in higher on average in the lower frequency bands than in the higher frequency bands. However, since the gain of each band is independent of other bands, a musical instrument will often be noticeably tonally changed since the fundamental and harmonics of a note often falls across many frequency bands. This method therefore breaks constraint c2.

A device which uses a method similar to multi-band compression is disclosed in U.S. Pat. No. 5,359,665 (Aphex Systems Ltd). This device is an analogue device which combines phase inverted, dynamically compressed bass frequencies with the original audio signal. It provides greater enhancement of the bass frequencies when they are at lower levels and less enhancement when they are at higher levels, thereby satisfying constraint c6. However, the device is not designed to work with stereo signals: if the device is used for the left and right channels of a stereo signal, the musical image will drift from side to side as the left and right gain factors are independent of one another. This breaks constraint c4. The device also does not employ a very low frequency cut-off filter that would prevent the breaking of constraint c7. For very small loudspeakers, this device would not be able to reproduce maximum level signals.

Published International Patent Application No. WO-A1-9846044 (K. S. Waves Ltd) describes an apparatus and method for bass enhancement The method uses the psychoacoustic principle of virtual pitch, in which the pitch of a musical note is recognized by the frequency spacing and relative level of the harmonics of the fundamental of that note. The method involves taking a certain range of bass frequencies and generating artificial harmonics of these frequencies which are at a higher frequency than the fundamental bass frequencies. The original bass frequencies are not actually present in the processed signal, only the artificial harmonics, as the fundamental does not need to be present for the pitch to be recognizable. However, audio signals which are processed using this method can be musically unpleasant as, for the effect to be noticeable, frequencies in the range 100 to 300 Hz must be quite loud. This breaks constraint c1. Also, the apparatus has many functional components and higher-order statistical processing which breaks constraint c5.

SUMMARY OF THE INVENTION

An aim of the present invention is to provide a method for modifying (i.e., enhancing) low frequency components (i.e., from ~40 to ~−150 Hz) of a digital audio signal. Another aim of the present invention is to provide a method for modifying low frequency components of a digital audio signal so that the signal is suitable for playing over small loudspeakers. A further aim of the invention is to provide a method for modifying low frequency components of a digital audio signal which does not violate the constraints c1 to c7.

According to the first aspect of the invention there is provided a method of modifying low frequency components of a digital audio signal as specified in the claims, and the product thereof.

According to a further aspect of the invention there is provided a computer program for implementing the method claimed.

BRIEF DESCRIPTION OF THE DRAWINGS

An embodiment of the Invention will flow be described, by way of example only, with reference to the accompanying Figures, in which:

FIG. 2 shows a combined plot of the frequency-gain characteristics of the high-pass and the band-pass filters.

DETAILED DESCRIPTION OF PREFERRED EMBODIMENTS OF THE INVENTION

Figure 1A:
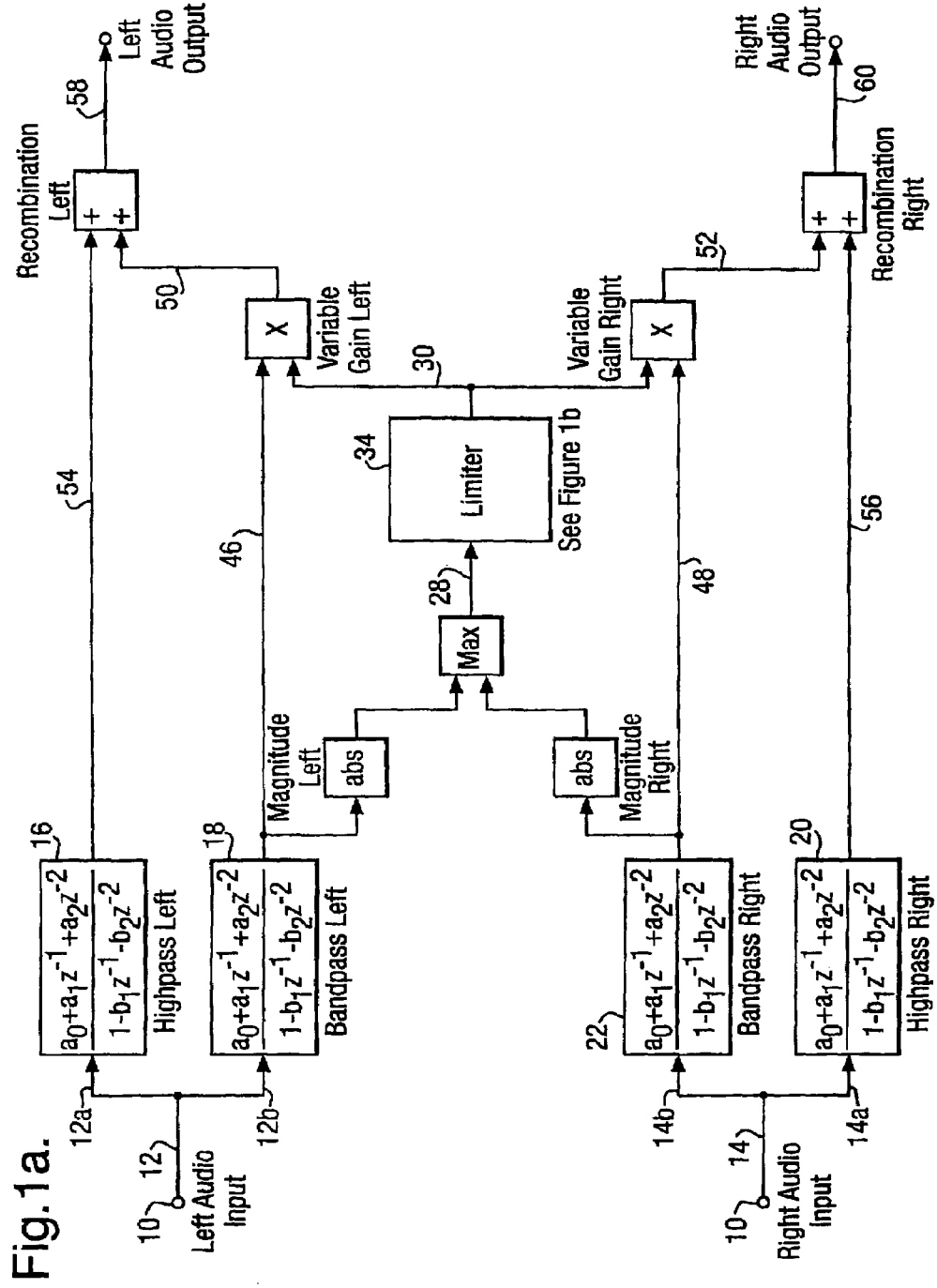
FIG. 1a shows a system diagram of the main method steps.

Referring to FIG. 1a, the first step of the method of the invention involves splitting the left (12) and right (14) channels of a digital audio signal (10) into two separate, identical signals to give a first (12a) and second (12b) left audio signal, and a first (14a) and second (14b) right audio signal. The first left (12a) and right (14a) audio signals are filtered by left (16) and right (20) high-pass filters, respectively. The left (16) and right (20) high-pass filters have the same filter characteristics.

The second left (12b) and right (14b) audio signals are passed through left (18) and right (22) band-pass filters, respectively. The left (18) and right (22) band-pass filters have the same filter characteristics. The band-pass filters (18, 22) are designed so that they completely attenuate frequencies below a certain frequency, depending on the type of loudspeakers on which the processed audio signal is to be played. The frequency-gain characteristics of the digital band-pass filters (18, 22) for use with hi-fi speakers are shown in FIG. 2. It is the relationship between the gain and the frequency of the band-pass filters (18, 22) that partly determines whether the constraints c1 to c7 are satisfied. It is noticeable that below the minimum frequency range of the speakers (i.e., ~50 Hz for hi-fi speakers), the band-pass filter is designed to attenuate dramatically.

The band-pass filters (18, 22) can be implemented as standard Butterworth infinite impulse response (IIR) filters, but the parameters of the filters depend upon the loudspeakers that the processed signal is to be played over. Table 1 below shows the design parameters for the band-pass filters (18,22) for different types of loudspeakers, where fs1 is the lower cut-off frequency, fs2 is the upper cut-off frequency, fp1 is the lower pass-band frequency, fp2 is the upper pass-band frequency, Ap is the pass-band ripple and As is the stop-band ripple.

TABLE 1

| Speaker Type | Lowest Frequency (Hz) | Butterworth Design Parameters fs1, fp1, fp2.fs2 (Hz), Ap, As (dB) |
|---|---|---|
| Notebook PC | 100 | 80, 100, 150, 180, 8, 11 |
| Multimedia PC | 80 | 50, 80, 120, 150, 8, 11 |
| Hi-Fi | 50 | 20, 50, 120, 150, 8, 11 |

It is essential that the method of the invention enhances only those frequencies that can be reproduced by the loudspeakers on which the audio signal is to be played. Very low frequency signals which are below the reproduction range of small loudspeakers must therefore be removed. The amount of attenuation of these very low frequency signals is dependent on the size of the loudspeaker, thereby ensuring that constraint c7 is not broken.

The frequency-gain characteristics of the high-pass filters (16, 20) are shown in FIG. 2. These filters are also implemented as Butterworth IIR filters and, again, the parameters of the filters depend upon the size of the loudspeakers that the signal is to be played over. Table 2 shows the design parameters for the high-pass filters (16,20) for different types of loudspeakers, where fs is the stop-band frequency, fp is the pass-band frequency, Ap is the pass-band ripple, and As is the stop-band ripple.

TABLE 2

| Speaker Type | Butterworth Design Parameters fs, fp (Hz), Ap, As (dB) |
|---|---|
| Notebook PC | 160, 190, 8, 14 |
| Multimedia PC | 140, 170, 8, 14 |
| Hi-Fi | 140, 170, 8, 14 |

The high-pass (16,20) and band-pass (18,22) filters divide each channel (12,14) of the stereo audio signal (10) into two separate frequency regions: a mid to high frequency region, and a low frequency region, respectively. The high-pass filters (16,20) have an attenuation of −0.8 dB for the mid- and high-range frequencies. This has the effect of shifting the attention of the listener so that the bass frequencies/instruments become more noticeable without breaking the constraints of c1 to c7.

In the next step of the method, the absolute magnitudes of the outputs of the left (18)

and right (22) band-pass filters are determined, and the signal with the largest amplitude is taken to be the control signal (28) This step is critical as it ensures that constraints c4 and c6 are not broken.

A level control circuit for low and medium sound is disclosed in U.S. Pat. No. 5,175,770 (Samsung). In this circuit, the left (12) and right (14) signals are added together using an adder before the main processing steps in the circuit are carried outs. However, the difficulty with this approach is that if the signal level in both the left and right input channels is larger than one half of the maximum signal amplitude, then the signal level at the output of the adder will be greater than unity, breaking constraint c6. It can be demonstrated that in a good deal of music, common-mode signals (i.e., those signals that appear with equal amplitude in both left and right channels) are indeed extremely likely to exceed half the maximum system amplitude. This is a significant problem for fixed-point digital arithmetic.

The methods disclosed in U.S. Pat. No. 4,182,930 (DBX Inc.) and U.S. Pat. No. 4,982,435 (Sanyo) both take a sum combination of the left and right input signals thereby creating a mono bass signal that is level adjusted and added it back to the left and right input signal. The problem with this approach is that it typically affects the stereo image of the bass signals in the music, thus breaking constraint c4.

Figure 1B:
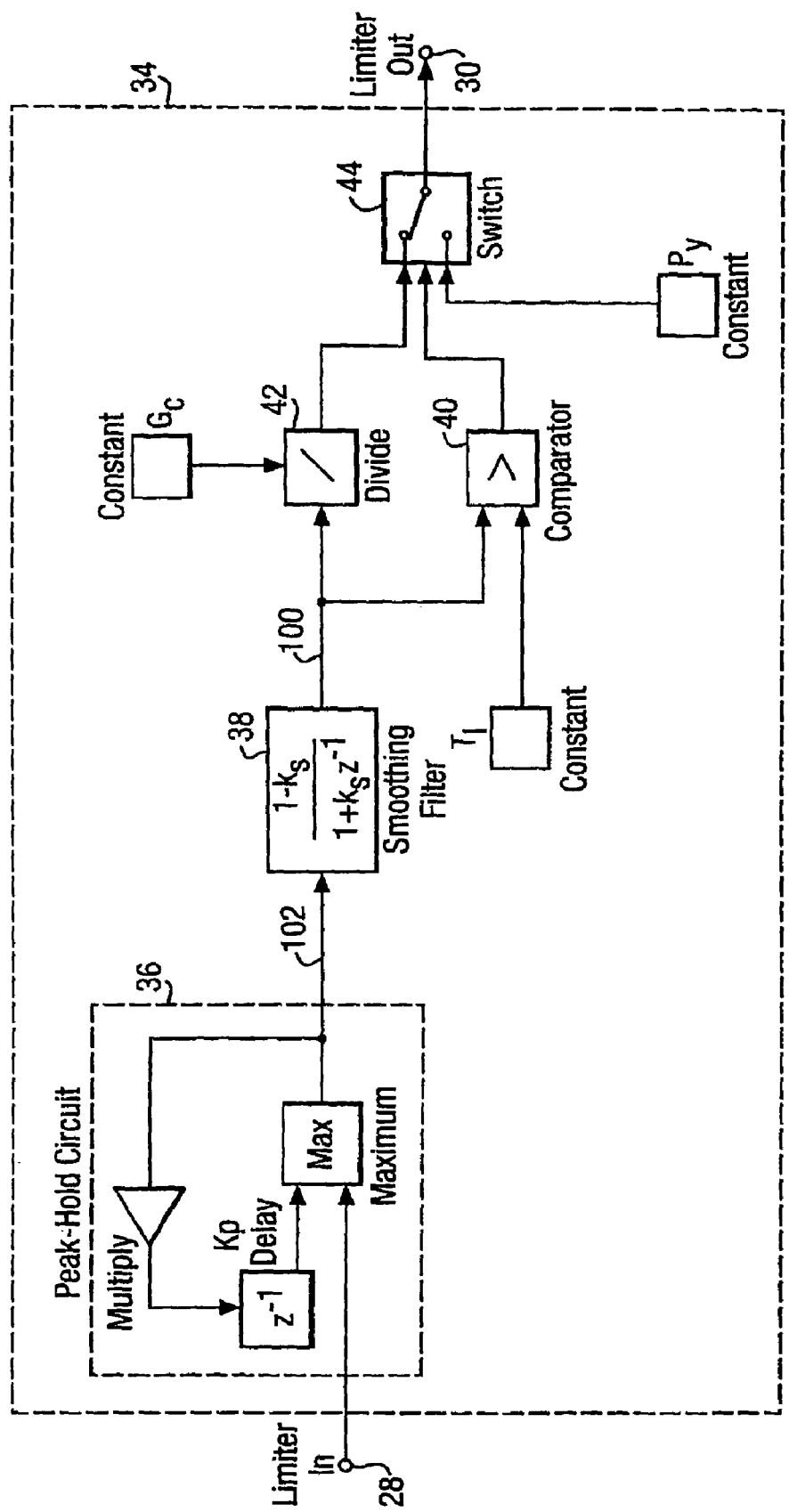
FIG. 1b shows a system diagram of a limiter used in the method.

In the next step of the method of the invention, the control signal (28) with the largest amplitude (either positive or negative), is then passed to a limiter (34). The purpose of the limiter (34) is to limit the dynamic range of the largest control signal (28) to below the limiter threshold value $T_1$, and then to amplify the limited signal to increase its energy. In this way, the 0 dB level (i.e., constraint c6) is not exceeded, but the signal energy is amplified. The detailed operation of the limiter (34) is illustrated by the circuit shown in FIG. 1b although, in practice the limiting function is carried out digitally.

Figure 1C:
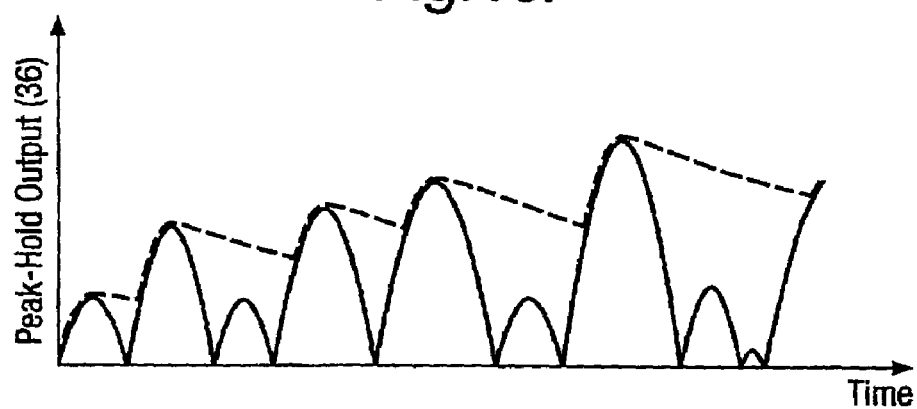
FIG. 1c shows the output of a peak-hold circuit.

The limiter (34) includes a peak-hold circuit (36), the typical output of which is shown by the dashed line in FIG. 1c. This peak-hold circuit functions by efficiently calculating the $L_\infty$ norm of the control signal (28) whose samples have been weighted according to an exponentially decaying envelope. The circuit function is described by the following operation:

$$y(z) = \|x(t-n)K_p^n\|_\infty$$

where t is the current time sample, n is the index of the normal (n $\in$ 0 ... $\infty$), y(t) is the current peak-hold sample, x(t) is the current peak-hold input sample, and $K_p$ is the decay coefficient. This operation smoothly tracks the peaks of the control signal (28) as they decay under the influence of the exponential envelope.

It is important that the decay time of the circuit (36) is set so that It accurately follows the amplitude of the control signal (and therefore the bass frequencies). It is also important that the circuit (36) does not clip wave peaks or hold for an excessive amount of time after the signal level of the bass frequencies has died away. The decay dine of the peak-hold circuit (36) depends solely upon the decay coefficient, $K_p$ and the sample rate S. The impulse response of the peak-hold circuit in decay mode is given by:

$$h(n) = |K_p|^n,$$

where $$K_p = \exp\left(\frac{\ln(10^{-6})}{S * T_p}\right),$$

and $T_p$ is the required delay time of the peak-hold, in seconds. The decay time is then the time taken for the peak-hold circuit to reach 1 millionth of the original amplitude. The optimum setting for $T_p$ was found to be 0.3 ($\pm 5\%$) seconds.

The output signal from the peak-hold circuit (36) is then filtered by a smoothing filter (38) which comprises a digital low-pass filter. It is important that the response of the smoothing filter (38) is set so that sharp peaks captured by the peak-hold circuit (36) are smoothed to prevent clicks in the processed output audio signal. As the smoothing filter (38) is a simple one pole low-pass filter, the feedback coefficient, $K_g$, is calculated as for the peak-hold circuit. Experimentation has revealed an optimum decay time, T1, for the smoothing filter (38) of 0.05 seconds. The Z-transform of the transfer function of the smoothing filter is given by:

$$H(z) = \frac{1 - Ks}{1 - Ks \cdot z^{-1}}$$

from which it can be seen that the smoothing filter (38) is normalized to have unity gain at 0 Hz. This is implemented as a standard difference equation for digital implementation.

Due to the complex relationship between the decay time of the peak-hold circuit (36) and the transient response of the smoothing filter (38), the smoothing filter takes some time to respond to peaks from the peak-hold circuit. As a result, there are moments when the output signal energy is larger than unity, breaking constraint c6. To compensate for this, a small headroom attenuation $H_r$ is subtracted from the control signal. For reasons of computational efficiency, the headroom attenuation is subtracted from the control signal in the following method step.

In the next step of the method, the amplitude of the output (100) of the smoothing filter (38) is adjusted. In analogue terms this is carried out using an amplitude adjustment circuit which comprises a divider (42), a comparator (40), and a switch (44). The comparator (40) 'informs' the switch (44) whether to select either 1) a post-gain constant $P_1$, in the case where the smoothing filter output (100) is less than or equal to the threshold level $T_1$, or 2) a headroom compensated gain, $G_c$, divided by the smoothing filter output (38) if the smoothing filter output (38) is more than the threshold level.

Figure 1D:
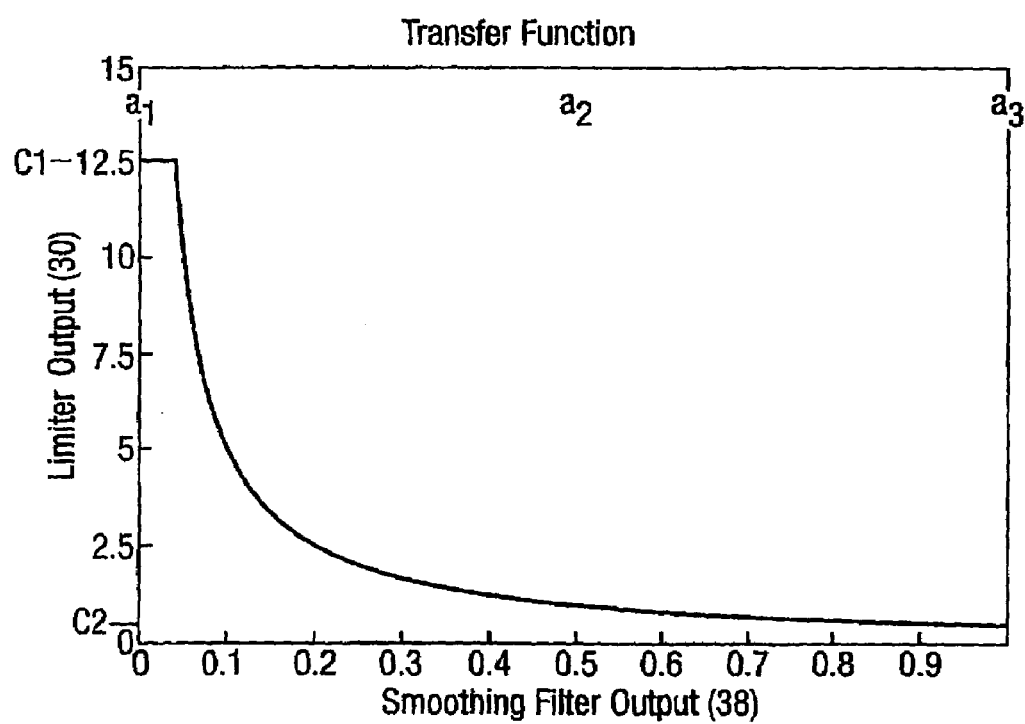
FIG. 1d shows the limiter input-output characteristics.

FIG. 1d shows that the effect of the amplitude adjustment circuit is to amplify the control signals that are between zero and the threshold level by a large, fixed amount, and to amplify control signals above the threshold level in a quantity inversely proportional to that level. The nature of the decreasing slope of the graph of FIG. 1d is such that when the smoothing filter output (100) is equal to the headroom compensated gain $G_c$, the control signal energy is unchanged, and when the smoothing filter output is unity (representing 0 dB), the control signal energy is attenuated by the headroom level $H_1$. In other words, FIG. 1d shows that when the amplitude of the bass frequency signals is very small, the bass frequencies are amplified by a large amount. When the amplitude of the bass frequencies is very large, they are attenuated by a small amount (i.e., the headroom value). There is, however, an equilibrium point at intermediate amplitude, when the bass frequencies are unchanged.

As mentioned previously for reasons of computational efficiency, the headroom attenuation implemented by combining the headroom value with the parameters $G_c$ and $P_g$ in the amplitude adjustment circuit. In practice, the headroom attenuation $H_r$ is set to 3.0 dB ($\pm 5\%$), although this may be adjusted depending on the type of music which is to be processed. The following three equations are used to obtain the linear values for the post-gain level $P_g$, the threshold level $T_1$, and the headroom compensated gain $G_c$:

$$P_g = 10^{0.1(-T_{1d} - H_{rd}51)}; \quad T_1 10^{0.1 T_{1d}}; \quad G_c = T_1 P_K;$$

where $T_{1d}$ is the negative threshold level in dB, and $H_{rd}$ is the positive headroom level in dB.

The limiter output control signal (30) is then used to vary the amplitude of the left (46) and right (48) output signals of the band-pass filters (18,22) to give modified left (50) and right (52) band-pass filtered signals. The modified left (50) and right (52) band-pass filtered signals are then recombined with the left (54) and right (56) high pass filtered signals, respectively, giving the bass enhanced left (58) and right (60) audio output signals.

The parameter which affects the degree to which the method of the invention satisfies constraint c2 is the limiter threshold level $T_1$. In choosing the limiter threshold, care must be taken to avoid tonal alteration of the processed signal. Tonal alteration results when the relative balance of low to high-order harmonics of an instrument are affected differently, depending upon whether they fall inside or outside the bass limiter frequency range (i.e., the range of the band-pass filter). It has been found experimentally that a threshold level $T_1$ of −14 dB (+5%) provides an optimum balance between maximum bass enhancement and minimum tonal alteration.

As the digital audio signal (10) consists of a large number of discrete samples, each step of the method is applied to every discrete sample in turn. For example, the step of calculating the absolute magnitude of the outputs of the left (18) and right (22) band-pass filters in order to find the control signal (28) is carried out on each discrete sample.

This means that the control signal (28) may be formed from the left channel in one sample, but from the right channel in the subsequent sample.

Variation may be made to the aforementioned embodiment without departing from the scope of the invention. For example, the method is also suitable for use with headphones. As headphones often have radically different frequency responses, it is possible to modify the design frequencies for the band-pass and high-pass filters such that the method can be matched to specific types of headphones such as in-ear, open or closed back headphones.

Different types of music have different dynamic characteristics. For example, dance music often has fast, staccato bass notes, and classical music has long, slow decaying notes. It is possible to provide a preset user control of parameters such as the decay coefficients $K_p$ and $K_d$. The user could then select the type of music they are listening to, and have the parameters downloaded from a preset table, These parameters may be derived experimentally for different types of music or, in a further variation to the invention, higher-order statistical measurement of the dynamics of the music could allow automatic adjustment of the control parameters $T_1$, $K_p$ and $K_1$, based on an adaptive midterm statistical measure. In addition, the parameters of the high-pass (16,20) and/or band-pass (18,22) filters may be user selectable—parameters such as the cut-off frequency, pass-band frequency, pass-band ripple and stop-band ripple.

In a further variation, the precise mathematical relationship between the control signal greater-than-unity excursions and the peak-hold and smoothing decay times could be formulated, rather than being determined experimentally. This would allow automatic setting of the gain restoration headroom parameter, which may need to be altered if the device were to have user presets for different types of music, or if higher-order statistical processing has been use.

What is claimed is:

1. A method of modifying low frequency components of a digital audio signal having left and right channel signals, the method comprising the steps of: a) filtering the left and right channels signals using respective left and right high-pass filters to form left and right high-pass filtered signals; b) filtering the left and right channel signals using respective left and right band-pass filters to form left and right low frequency signals; c) modifying the amplitude of the left and right low frequency signals to give modified left and right low frequency signals whereby signals with amplitude a where 0<a<a1 are amplified by a first constant value C1, signals with amplitude a1≦a <a2 are amplified proportional to 1/a, signals with amplitude a≦a2 are unchanged, signals with amplitude a2<a<a3 are attenuated proportional to 1/a, and signals with amplitude a=a3 are attenuated by a second constant value C2; and d) combining the modified band-pass filtered left and right signals with the respective left and right high-pass filtered signals to form respective modified left and right channel audio signals.

2. A method according to claim 1 wherein in step c), the amplitude a of the signal is taken to be the amplitude of the left or right low frequency signal which has the largest absolute value.

3. A method according to claim 2 wherein the first constant value C1 is 12.5.

4. A method according to claim 1 wherein the second constant value C2 is 0.5.

5. A method according to claim 1 wherein a1=0.04.

6. A method according to claim 1 wherein a2=0.5.

7. A method according to claim 1 wherein a3=1.

8. A method according to claim 1 wherein the digital audio signal is an MP3 encoded signal.

9. A method according to claim 1 wherein the digital audio signal is in WAV format.

10. A method according to claim 1 wherein the parameters of the band-pass filters are user selectable.

11. A method according to claim 1 wherein the parameters of the high-pass filters are user selectable.

12. A method as claimed in claim 1 using a limiter having a transfer function having an output amplitude substantially equal to a constant value of 12.5 for input amplitude values ranging from about 0 to 0.04, and a value inversely proportional to the input amplitude for input amplitude values from 0.04 to 1.0.

13. An audio filtering system comprising at least one digital filter, the system configured to perform the method as recited in claim 1.

14. The method as recited in claim 1 wherein the left and right band pass filters are implemented as Butterworth infinite impulse response filters.

15. A method of enhancing the low frequency parts of an audio signal, the method comprising:
providing an audio signal to at least one bandpass filter to generate left and right low frequency signals;
deriving a control signal from the left and right low frequency signals, the control signal determined based on the respective low frequency signal having the larger absolute magnitude at each time point;
modifying the control signal by limiting its dynamic range such that the amplitude of the modified control signal has a first constant value C1 for input amplitudes between o and a1 and a value inversely proportional to input amplitude for input amplitude values greater than or equal to a1 but less than a3; and
amplifying the left and right low frequency signals using the modified control signal.

16. The method as recited in claim 15 wherein the at least one bandpass filter is configured to completely attenuate frequencies below a certain predetermined frequency.

17. The method as recited in claim 16 wherein the amplitude of the modified control signal is selected to provide a gain to the left and right low frequency signals at input amplitude values greater than or equal to a1 but less than a2, and to provide an attenuation for input amplitude values greater than a2 but less than or equal to a3, wherein signals with an input amplitude a3 are attenuated by a constant value C2.

* * * * *